US006943114B2

United States Patent
Wrschka et al.

(10) Patent No.: US 6,943,114 B2
(45) Date of Patent: Sep. 13, 2005

(54) INTEGRATION SCHEME FOR METAL GAP FILL, WITH FIXED ABRASIVE CMP

(75) Inventors: Peter Wrschka, Wappingers Falls, NY (US); Werner Robl, Poughkeepsie, NY (US); Thomas Goebel, Fishkill, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/084,194

(22) Filed: Feb. 28, 2002

(65) Prior Publication Data

US 2004/0248399 A1 Dec. 9, 2004

(51) Int. Cl.[7] .................. H01L 21/302; H01L 21/461
(52) U.S. Cl. ................... 438/692; 438/693; 438/959
(58) Field of Search ................. 438/692, 693, 438/959, FOR 111

(56) References Cited

U.S. PATENT DOCUMENTS

| | | | |
|---|---|---|---|
| 5,692,950 A | | 12/1997 | Rutherford et al. |
| 5,795,495 A | * | 8/1998 | Meikle .................. 216/88 |
| 5,850,105 A | | 12/1998 | Dawson et al. |
| 5,897,426 A | | 4/1999 | Somekh |
| 5,958,794 A | | 9/1999 | Bruxvoort et al. .......... 438/692 |
| 6,007,407 A | * | 12/1999 | Rutherford et al. .......... 451/41 |
| 6,034,418 A | * | 3/2000 | Matsuura .................. 257/632 |
| 6,037,278 A | | 3/2000 | Koyanagi et al. |
| 6,232,171 B1 | | 5/2001 | Mei |
| 6,232,231 B1 | | 5/2001 | Sethuraman et al. |

(Continued)

FOREIGN PATENT DOCUMENTS

EP    1 068 928 A2    1/2001

OTHER PUBLICATIONS

Wolf, S., *Silicon Processing for the VLSI Era*, vol. 2, Lattice Press, Sunset Beach, California (1990) pp. 189–193.
Penka, S., et al., "Integration Aspects of Flowfill and Spin–on–Glass Process for Sub–0.35μm Interconnects," Interconnect Technology Conference, Proceedings of the IEEE 1998 International (Jun. 1–3, 1998) pp. 271–273.
Mendonca, J., et al., "Interconnect Material and CMP Process Change Effects on Local Interconnect Planarity," Interconnect Technology Conference, Proceedings of the IEEE 1998 International (1998) pp. 196–198.

*Primary Examiner*—George Fourson
*Assistant Examiner*—Michelle Estrada
(74) *Attorney, Agent, or Firm*—Slater & Matsil, L.L.P.

(57) ABSTRACT

In a method of planarizing a semiconductor wafer, the improvement comprising polishing above metal interconnect lines to uniformly polish the topography of the wafer to a predetermined endpoint on the wafer sufficiently close above the metal interconnect lines, yet far enough away from the lines to prevent damage to the lines, comprising:

a) filling gaps between metal interconnect lines of an inter metal dielectric in a wafer being formed, by depositing HDP fill on top of the metal interconnects, between the metal interconnects, and on the surface of a dielectric layer between the metal interconnects to create an HDP overfill;

b) contacting the surface of HDP overfill of the processed semiconductor wafer from step a) with a fixed abrasive polishing pad; and c) relatively moving the wafer and the fixed abrasive polishing pad to affect a polishing rate sufficient to reach a predetermined endpoint and uniformly planar surface on the wafer sufficiently close above the metal interconnect lines and yet far enough away from the lines to prevent damage to the lines.

7 Claims, 3 Drawing Sheets

U.S. PATENT DOCUMENTS

| | | |
|---|---|---|
| 6,234,875 B1 | 5/2001 | Pendergrass, Jr. ............ 451/41 |
| 6,310,375 B1 | 10/2001 | Schrems |
| 6,325,702 B2 | 12/2001 | Robinson ..................... 451/41 |
| 6,350,692 B1 | 2/2002 | Economikos et al. |
| 6,435,942 B1 | 8/2002 | Jin et al. |
| 6,653,242 B1 * | 11/2003 | Sun et al. ................... 438/738 |
| 6,656,842 B2 * | 12/2003 | Li et al. ..................... 438/691 |
| 2002/0074311 A1 | 6/2002 | Funkenbusch |
| 2003/0029212 A1 | 2/2003 | Im |
| 2003/0176151 A1 * | 9/2003 | Tam et al. ................... 451/41 |

\* cited by examiner

INTEGRATION SCHEME FOR METAL GAP FILL, WITH FIXED ABRASIVE CMP

BACKGROUND OF THE INVENTION

1. Field of Invention

The invention relates to an integration scheme for metal gap fill with a Fixed Abrasive CMP (chemical mechanical polishing feature (FAP) to enable polishing of the topography only of an oxide or metal layer, when modifying the exposed surface of a semiconductor wafer.

2. Description of the Related Art

In a process integration scheme for preparing a semiconductor wafer, the wafer typically undergoes many processing steps, and these processing steps include deposition, patterning, and etching steps. Typically, at each step during the manufacturing process, it is useful to attain a predetermined level of uniformity and/or planarization. Further, it is also useful to minimize any surface defects in the wafer, such as scratches and pits, since these surface defects will affect the performance of the ultimate patterned semiconductor wafer.

One well known method for reducing surface irregularities during the manufacture of semiconductor wafers is to treat the wafer surface with a slurry that contains a plurality of loose abrasive particles using a polishing pad.

U.S. Pat. No. 6,007,407 disclose a method of modifying an exposed surface of a semiconductor wafer comprising:

(a) contacting the surface with an abrasive construction comprising a three-dimensional, fixed abrasive element having raised portions and recess portions, wherein the raised portions comprises abrasive particles and binder; at least one resilient element coextensive with the fixed abrasive element; and at least one rigid element coextensive with and interposed between the resilient element and the fixed abrasive element; wherein the rigid element has a Young's Modulus greater than that of the resilient element; and (b) relatively moving the wafer and the abrasive construction to modify the surface of the wafer.

A method of modifying a processed semiconductor wafer containing topographical features is disclosed in U.S. Pat. No. 5,958,794. The method entails:

(a) contacting an exposed surface of the semiconductor wafer with a three-dimensional, textured, fixed abrasive article comprising a plurality of abrasive particles and a binder arranged in the form of a pattern; and (b) relatively moving the wafer and the fixed abrasive article in the presence of a liquid medium to chemically and mechanically modify the surface of the wafer.

U.S. Pat. No. 6,325,702 B2 disclose a method for chemical-mechanical-polishing (CMP) to selectively remove a first material over a second material, wherein said first material and said second material form part of a substrate assembly. The method comprises:

selecting a pad configured to remove the first material more rapidly than the second material, the pad being formed at least in part of an intrinsically non-porous material with respect to CMP solution particles to be used therewith, the pad formed with spaced-apart contact portions;

the contact portions separated by at least one non-contact portion, the contact portions formed of the intrinsically non-porous material to provide a surface to contact the substrate assembly during CMP, the contact portions spaced-apart to provide a duty cycle, the duty cycle determined at least in part by:

selecting a contact width for the contact portions based at least in part on the CMP solution, the first material, and the second material;

selecting a non-contact width associated with spacing of the contact portions, the non-contact width selected based at least in part on the CMP solution, the first material, and the second material; placing the pad on a chemical-mechanical-polisher platform; providing the CMP solution to the pad; and polishing the substrate assembly using the pad and the CMP solution.

A method of modifying a surface of a semiconductor wafer is disclosed in U.S. Pat. No. 6,234,875 B1, and comprises:

(a) contacting the surface to be modified with a working surface of an abrasive article, the working surface comprising a phase separated polymer having a first phase and a second phase, the first phase being harder than the second phase; and (b) relatively moving the surface to be modified and the abrasive article to remove material from the surface to be modified in the absence of an abrasive slurry.

In the integration schemes of existing methods for reducing surface irregularities in manufacturing semiconductor wafers, there is a need for: process simplification and cost reduction;

improvement in the process for obtaining uniformity; preventing metal line damage due to CMP; and elimination of CMP "send aheads."

SUMMARY OF THE INVENTION

One object of the present invention is to provide, in an integration scheme for metal gap fill when making semiconductor wafers, process simplification and cost reduction.

Another object of the present invention is to provide, in an integration scheme for metal gap fill during semiconductor wafer manufacturing, an improvement of process uniformity.

A further object of the present invention is to provide, in an integration scheme for metal gap fill during manufacture of a semiconductor wafer, prevention of metal line damage due to CMP.

An object further still of the present invention is to provide, in an integration scheme for metal gap fill during manufacture of a semiconductor wafer, means for elimination of CMP "send aheads".

In general, the invention integration scheme for metal gap fill using fixed abrasive CMP is accomplished by: filling gaps between metal lines on a semiconductor chip with a high density plasma (HDP); lowering the overfill of the HDP process using FAP to less than 50 nm above the metal lines that remain between the roofs by virtue of the fact that the FAP process polishes only the typography and affects an automatic stop when the wafer is planarized. After the polishing process using FAP, a silane oxide of desired thickness may be deposited as a cap.

BRIEF DESCRIPTION OF THE DRAWING FIGURES

DETAILED DESCRIPTION OF PREFERRED EMBODIMENT OF THE INVENTION

Generally speaking, it is known that the fixed abrasive CMP process (FAP) makes it possible to polish only the topography of an oxide or metal layer, and that the process stops automatically when the topography is removed. The FAP process is characterized by the advantages of: improved uniformity; neglegible dishing and pattern erosion and an increased process window—all of which makes endpoint detection unnecessary.

In the case of borophosphosilicate glass (BPSG) polish the FAP process is further characterized by the benefits of a high selectivity between nitride and oxide (especially for the Obsidian tool) since the nitride above the gate conductor will not be eroded and this will increase the process window in terms of shorts for the CB etch. Furthermore, FAP will not dish in the oxide spacers, thereby avoiding topological problems.

In the case of a ILD polish using the FAP process, the benefits for ILD polish is that, high aspect ratio metal or Al lines are filled with HDP and capped with a silane oxide layer. The dielectric is then polished back to the desired ILD thickness. However, this integration scheme has certain disadvantages in terms of uniformity. As a result the thickness, non-uniformity can affect e.g. the CL Al fill, which is very critical to the aspect ratio of the CL via.

On the other hand, the high density plasma-fixed abrasives CMP (FAP)-silane integration scheme for the inter metal dielectrics of the invention process, is an integration scheme wherein the gaps between the metal lines are filled with HDP. The overfill of the HDP process is then lowered so that only less than 50 nm above the metal or Al lines remains between the roofs. The invention FAP process polishes only the topography with an automatic stop, when the wafer is planarized. This leads to a reduced polishing time during FAP. The remaining oxide thickness on top of the Al lines is less than 50 nm. After this polish process, a silane oxide of the desired thickness is then deposited.

Figure 1A:
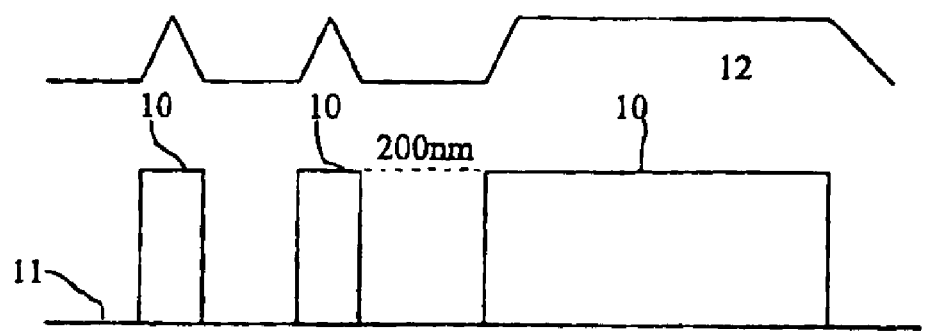
FIG. 1A is a schematic cross sectional view of a portion of a semiconductor wafer of a prior art, after HDP fill.
Figure 1B:
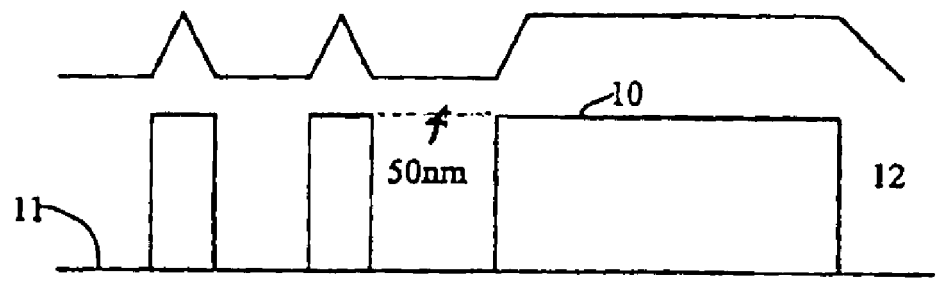
FIG. 1B is a schematic cross sectional view of a portion of a semiconductor wafer after the process integration scheme of the invention for HDP metal gap fill with fixed abrasive CMP.

FIG. 1A is a simplified view of a schematic cross-section of a portion of a semiconductor wafer of the prior art, after HDP fill. As can be seen, the metal interconnects 10 are made by first depositing a continuous layer of metal onto a dielectric layer 11, after which the metal is etched and the excess metal removed to form the desired pattern of metal interconnects 10. Thereafter, an insulating layer that is typically a metal oxide such as silicon dioxide is applied over each of the metal interconnects, and between the metal interconnects and over the top surface of a dielectric layer 11. However, before any additional layer of circuitry is applied via a photolithography process, it is usually desirable to treat the surface of the insulating layer to achieve a given degree of planarity. Instead of applying an insulating layer over the top of each metal interconnect and between the metal interconnect, (wherein the insulating layer is a metal oxide such as silicon dioxide, borophosphosilicate glass (BSG) phosphosilicate glass (BSG) or combinations thereof), a high density plasma (HDP) 12 may be applied. However, when the HDP layer or overfill is lowered, as for example by planarization of various types, the overfill of the HDP process creates a remaining oxide thickness on top of the metal interconnect lines (i.e. Al lines). Unfortunately, the planarization processes of CMP when used on HDP overfill stops with removal of topography that leaves approximately 200 nm on top of the metal or Al lines to prevent damage of the metal line due to chemical mechanical polishing or planarization (CMP). This is clearly shown in FIG. 1A. On the other hand, and by contrast, when a high density plasma (HDP) physical vapor deposition process is used to deposit an insulating layer over the top of the metal interconnects, between the metal interconnects and on the surface of the dielectric layer 11, the use of fixed abrasive CMP processes (FAP) is able to affect planarity by polishing to remove topography of the semiconductor wafer with an automatic stop at a predetermined endpoint that leaves the remaining oxide thickness on top of the metal or Al lines to less than about 50 nm, without damage of the metal or Al line normally caused by CMP, as shown in FIG. 1B.

Figure 2A:
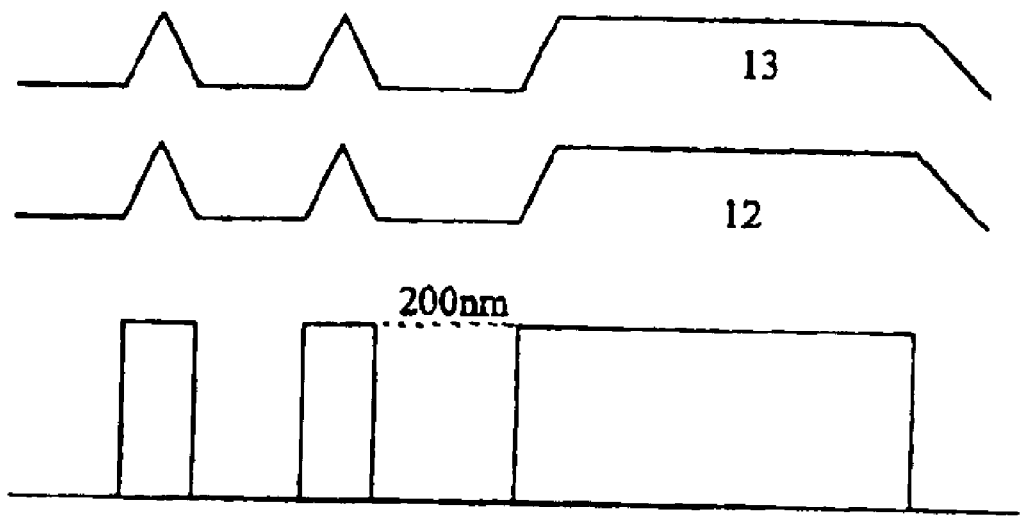
FIG. 2A depicts a schematic cross sectional view of a portion of a semiconductor wafer of a prior art after HDP fill and silane capping.
Figure 2B:
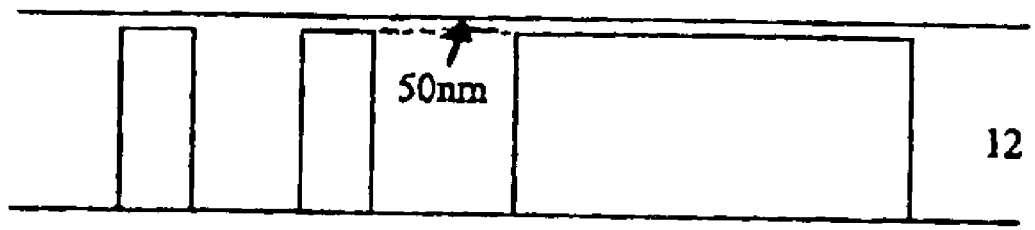
FIG. 2B is a schematic cross sectional view of a portion of a semiconductor wafer after the invention process integration scheme for metal gap fill, with fixed abrasive CMP.

FIG. 2A depicts a schematic cross-sectional view of a portion of a semiconductor wafer of a prior art HDP fill after silane capping. The silane cap 13 disposed on top of the HDP 12 still evidences that the overfill of the HDP, even after the silane cap could only be lowered to about 200 nm after CMP above the metal or Al lines remaining between the roofs. FIG. 2B, by contrast, shows that after the HDP fill 12 is subjected to the invention integration scheme or metal gap HDP fill followed by a fixed abrasive CMP process (FAP), the planarization effects the topography by stopping when the HDP fill is lowered to a predetermined height of only less than about 50 nm above the metal or Al lines.

Figure 3A:
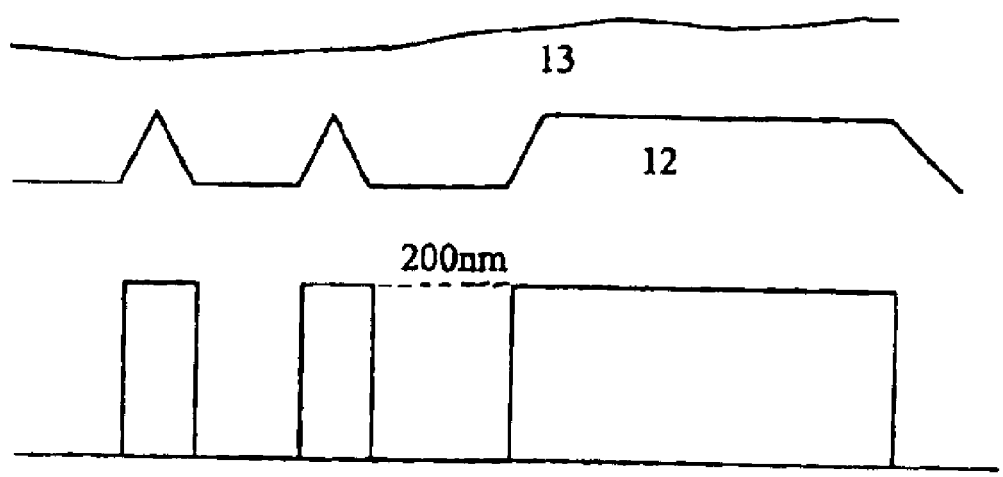
FIG. 3A is a schematic cross sectional view of a portion of a semiconductor wafer of a prior art process, after HDP fill, silane capping and CMP.
Figure 3B:
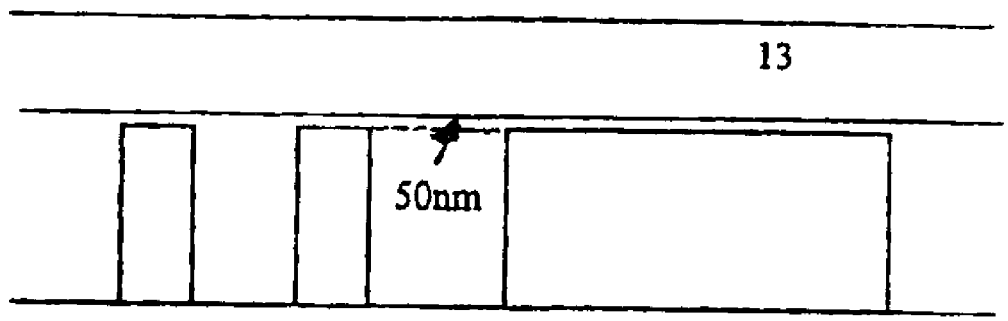
FIG. 3B depicts a schematic cross sectional view of a portion of a semiconductor wafer after the invention process integration scheme, for HDP metal gap fill, silane capping and fixed abrasive CMP.

FIG. 3A shows a schematic cross-sectional view of a portion of a semiconductor wafer of a prior art process after chemical mechanical polishing (CMP). Clearly, the overfill of the HDP upon polishing away the topography leaves about 200 nm of the HDP above the metal or Al lines between the roofs of the HDP. Referring now to FIG. 3B, it can be seen that, upon subjecting the wafer with a HDP fill to invention fixed abrasive CMP, planarization of the topography is reached, and the silane cap later deposited on the overfill of the planarized HDP that is lowered to a height less than about 50 nm above the metal or Al lines is more planar.

In the context of the invention, a high density plasma (HDP) is one which fills entirely the volume it is in and is characterized by an average ionization density that is greater than $10^{11}$ $cm^{-3}$. A predetermined endpoint on the wafer sufficiently close above the metal interconnect lines, yet far enough away from the lines to prevent damage to the lines is above 50 nm, and preferably less than 50 nm. A fixed abrasive polishing pad is one made from abrasive particles fixedly dispersed in a suspension medium and used in conjunction with planarizing solutions that do not contain an abrasive.

The advantages of the invention process integration scheme for HDP metal gap fill followed by fixed abrasive CMP provides: improved uniformity of the ILD thickness to avoid high flyers in contact resistance of CL chains; prevention of metal line damage during oxide CMP over polish; cost reduction with throughput improvement [inclusive of reduced HDP thickness (reduced deposition time), shorter CMP time and reduced site deposition time].

We claim:

1. A method of planarizing a semiconductor wafer, the method comprising:
   a) filling gaps between metal interconnect lines formed on a wafer by depositing HDP fill on top of the metal interconnects and between the metal interconnects to create an HDP overfill;
   b) contacting the surface of the HDP overfill with a fixed abrasive polishing pad; and
   c) relatively moving said wafer and said fixed abrasive polishing pad to affect a polishing rate sufficient to reach a predetermined endpoint and a substantially planar surface on the wafer sufficiently close above the metal interconnect lines and yet far enough away from said lines to prevent damage to said lines, said predetermined endpoint on the wafer being equal to or less than about 50 nm.

2. The method of claim 1 wherein said metal interconnect lines are selected from the group consisting of aluminum, titanium, copper, tungsten and mixtures thereof.

3. The method of claim 2 wherein said metal interconnect lines are aluminum.

4. The method of claim 2 wherein said metal interconnect lines are titanium.

5. The method of claim 2 wherein said metal interconnect lines are copper.

6. The method of claim 2 wherein said metal interconnect lines are tungsten.

7. In a method of planarizing a semiconductor wafer, the improvement comprising polishing above metal interconnect lines to uniformly polish the topography of the wafer to a predetermined endpoint on the wafer sufficiently close above the metal interconnect lines, yet far enough away from said lines to prevent damage to the lines, comprising:
   a) filling gaps between metal interconnect lines of an inter metal dielectric in a wafer being formed, by depositing HDP fill on top of the metal interconnects, between the metal interconnects, and on the surface of a dielectric layer between said metal interconnects to create an HDP overfill;
   b) contacting the surface of HDP overfill of the processed semiconductor wafer from step a) with a fixed abrasive polishing pad; and
   c) relatively moving said wafer and said fixed abrasive polishing pad to affect a polishing rate sufficient to reach a predetermined endpoint and uniformly planar surface on the wafer sufficiently close above the metal interconnect lines and yet far enough away from said lines to prevent damage to said lines, said predetermined endpoint on the wafer being equal to or less than about 50 nm.

* * * * *